(12) United States Patent
Sato

(10) Patent No.: US 11,984,050 B2
(45) Date of Patent: May 14, 2024

(54) PRODUCT WITH INCORPORATED OPERATION DISPLAY PANEL

(71) Applicant: mui Lab, Inc., Kyoto (JP)

(72) Inventor: Munehiko Sato, Kyoto (JP)

(73) Assignee: Mui Lab, Inc., Kyoto (JP)

( * ) Notice: Subject to any disclaimer, the term of this patent is extended or adjusted under 35 U.S.C. 154(b) by 29 days.

(21) Appl. No.: 17/257,579

(22) PCT Filed: Jul. 22, 2020

(86) PCT No.: PCT/JP2020/028587
§ 371 (c)(1),
(2) Date: Jan. 3, 2021

(87) PCT Pub. No.: WO2021/181716
PCT Pub. Date: Sep. 16, 2021

(65) Prior Publication Data
US 2022/0406227 A1    Dec. 22, 2022

(30) Foreign Application Priority Data
Mar. 8, 2020   (JP) .................................. 2020-039425

(51) Int. Cl.
*H01L 25/075* (2006.01)
*G06F 3/041* (2006.01)
*G09F 9/30* (2006.01)
*H01L 33/58* (2010.01)

(52) U.S. Cl.
CPC .............. *G09F 9/30* (2013.01); *G06F 3/0412* (2013.01); *H01L 25/0753* (2013.01); *H01L 33/58* (2013.01)

(58) Field of Classification Search
None
See application file for complete search history.

(56) References Cited

U.S. PATENT DOCUMENTS

2023/0290293 A1* 9/2023 Sato .................... G09G 3/2003
                                                                  438/22

FOREIGN PATENT DOCUMENTS

| JP | 62-056930 A | 3/1987 |
|---|---|---|
| JP | 01-092632 U1 | 6/1989 |
| JP | 2004-109615 A | 4/2004 |
| JP | 2010-058436 A | 3/2010 |

(Continued)

*Primary Examiner* — Asok K Sarkar
(74) *Attorney, Agent, or Firm* — Ogilvie Law Firm

(57) ABSTRACT

The present invention provides a product with incorporated operation display panel that further improves visibility at the time of light emission. The product with incorporated operation display panel includes a transparent conductive sheet, a display panel with a touch sensor furnished at least with light emitting elements consisting of light emitting elements arranged in two dimensions and being the product with incorporated operation display panel furnished with a thin layer that covers the total or a part of the front surface of a display panel, and a transparent substrate that forms a light guiding path is disposed at an opening between a transparent conductive sheet and a thin layer, or at an opening between a transparent conductive sheet and a light emitting device array substrate. The transparent base has micropores provided in a resin base material made of a transparent resin, and the micropores are formed by a lattice-like louver.

20 Claims, 4 Drawing Sheets

(56) References Cited

FOREIGN PATENT DOCUMENTS

| JP | 2014-142637 A | 8/2014 |
|----|---------------|--------|
| WO | 2014/024658 A1 | 2/2014 |
| WO | 2019/082399 A1 | 5/2019 |

* cited by examiner (1)

(2)

Fig.5    (PRIOR ART)
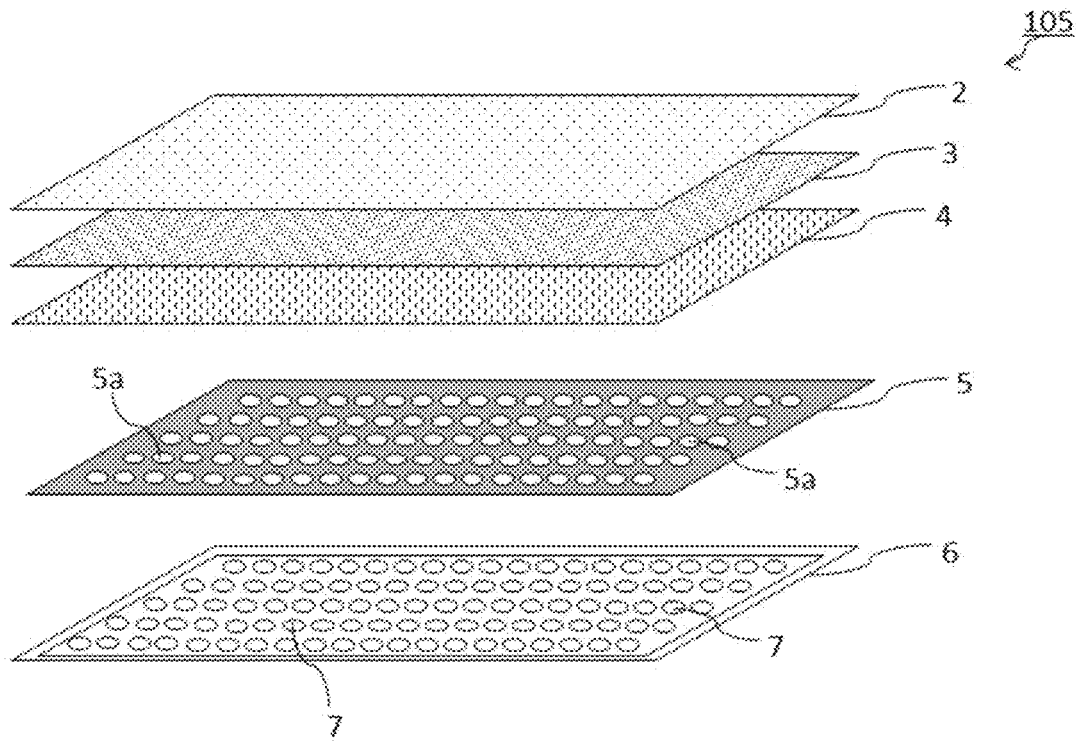
Fig.6    (PRIOR ART)
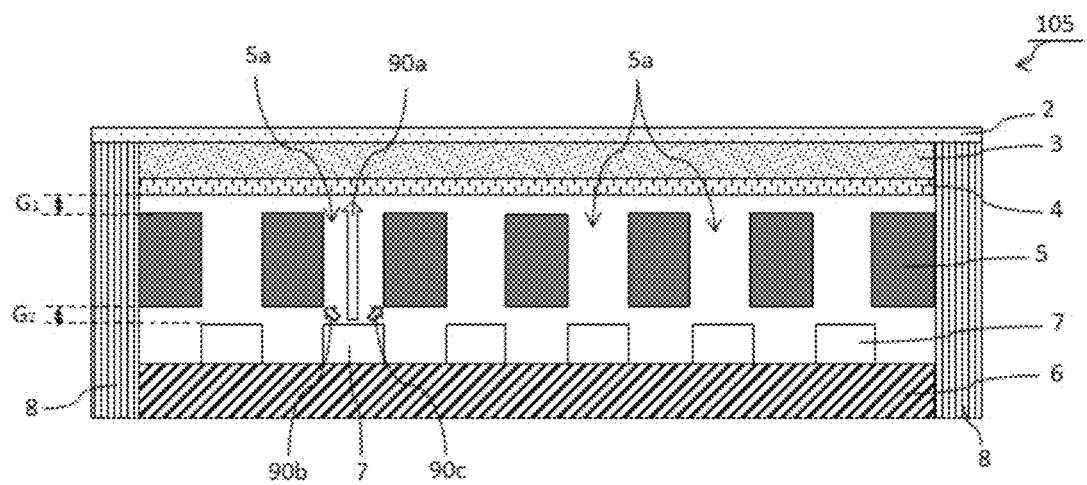

PRODUCT WITH INCORPORATED OPERATION DISPLAY PANEL

RELATED APPLICATIONS

The present application claims priority to, and incorporates by reference the entirety of, PCT application no. PCT/JP2020/028587 filed 22 Jul. 2020, and Japanese patent application no. 2020-039425 filed 8 Mar. 2020.

TECHNICAL FIELD

The present invention relates to an operation display device mounted on a controller of a home appliance, a display of an electronic device, or a movable body such as an automobile.

BACKGROUND ART

In recent years, information communication technology has undergone remarkable progress. In the past, personal computers were used only in limited spaces such as homes and offices, but with the spread of smartphones and tablet terminals, today it has become possible for anyone to live a highly convenient life using the Internet and so on. Also, from the viewpoint of the Internet of Things (IoT), new products using the Internet are being developed one after another for home appliances and the like that had not been conventionally connected to the Internet. Thus, the Internet and products using the Internet have already become indispensable to people's lives, and they are installed or carried everywhere and used by many people.

However, while people can enjoy a very convenient life by having all kinds of electronic devices existing around them, there are many people who feel stressed about living surrounded by electronic devices.

For example, a hotel that treasures the warmth of natural trees can be said to provide a high-quality space where guests can relax and forget their work, etc. However, if there are a large number of electronic devices, displays or controllers having inorganic forms in such guest rooms, it will not be possible for guests to forget daily life and relax sufficiently.

Therefore, a product is known with an incorporated operation display panel wherein a thin layer constituting wood or such material is incorporated at an outer surface of a housing covering a display panel front surface, with a touch sensor built in the outer surface of the housing (refer to Patent literature 1). This is designed so that the contents displayed on the panel can be visually recognized, and according to such a technology even a product with an operation display panel incorporated does not become visual noise for a user, by naturally harmonizing with a space and when a user wants or needs to operate the display, it is possible for the user to operate the display intuitively while feeling the touch of a natural material.

Also, the product with an incorporated operation display panel in Patent Document 1 is said to be equipped with a light guide that guides the light emitting direction of the light emitting element between a transparent sheet and a light emitting array. The light guide here refers to a dark color opaque base material laminated to a substrate of a light emitter array, pointing up an article covering up the whole of a light emitting element array provided with through holes along the optical axis of each light emitting element. By providing through holes along each optical axis of the light emitting element, visibility at the time of light emission can be improved.

However, in the structure in which the thin layer is provided on the front surface of the display panel, there is still a need to further improve the visibility at the time of light emission.

PRIOR ART

Patent Literature

[Patent literature 1] JP 6370519 B

OUTLINE OF THE INVENTION

Problems to be Solved by the Invention

In view of such a situation, it is an object of the present invention to provide a product with an incorporated operation display panel that further improves visibility at the time of light emission.

Means to Solve the Objects

In order to solve the above problems, a product with an incorporated operation display panel of the present invention includes a transparent conductive sheet, a display panel with a touch sensor furnished with light emitting elements arranged in two dimensions and is furnished with a thin layer that covers all or part of a front surface of the display panel, and a transparent substrate that forms a light guiding path is disposed at an opening between a transparent conductive sheet and a thin layer, or at an opening between a transparent conductive sheet and a light emitting device array substrate.

By providing a transparent base that forms a light guide path in the optical axis direction of the light emitting element, the light of the light emitting element can be efficiently propagated straightly. As a result, the loss of light is reduced, the amount of light when displayed on a thin layer is increased, and the display performance can be improved. In addition, effects such as cost reduction and miniaturization of light emitting element components, and suppression of power consumption and heat generation, can be achieved. Further, the miniaturization of the light emitting element component contributes to the densification of pixels.

Also, unlike the light guide of the conventional technology, it is not necessary to align the light emitting element and the transparent base, so that the manufacturing cost can be reduced.

In a product with an incorporated operation display panel of the present invention, in the transparent base, micropores are provided in a resin base material made of a transparent resin. Said micropores are formed by lattice-like louvers. Preferably, a gap between the lattice-like louvers becomes a light waveguide along the optical axis of a light emitter arranged on the light emitter array substrate. Also, the transparent base may be made of a resin base material composed of transparent resin furnished with micropores, and said micropores may be filled with a translucent material having a refractive index different from that of the resin base material. A resin base material is made of a transparent resin provided with micropores formed by lattice-shaped louvers, or as a transparent base wherein micropores provided in a resin base material are filled with a translucent material. A known privacy filter is preferably used. The privacy filter is a sheet-like filter obtained by laminating a film having a delicate louver structure with a PET (Polyethylene terephthalate) film, for example. The privacy filter allows the light to travel straight to increase the amount of light, and the material properties of the thin layer diffuse the straight light as it passes through the thin layer, resulting in a clear display on the thin layer surface and a wider viewing angle.

In the present specification, the shape of the micropores is not particularly limited, and may be not only a circular hole in a planar view but also a polygonal shape such as a hexagon in a planar view.

In a product with an incorporated operation display panel of the present invention, micropores are formed by lattice-shaped louvers, and gaps between the lattice-shaped louvers become a light guide path along the optical axis of the light emitting elements arranged on the light emitting element array substrate. As a result, the light of the light emitting element can efficiently travel straight, and the display performance can be improved.

In a product with an incorporated operation display panel of the present invention, the transparent base may be at least two louver films laminated so that the louvers are orthogonal to each other. By laminating a plurality of louver films, the light of the light emitting element can be efficiently propagated straightly at low cost even when a grid-like louver is not used, and the display performance is improved.

In a product with an incorporated operation display panel of the present invention, the transparent substrate may be composed of an aggregate of fine fibers. Since the transparent base is made of an aggregate of fine fibers, the light of the light emitting element can propagate straightly with efficiency, and the display performance can be improved.

In a product with an incorporated operation display panel of the present invention, a fine fiber such as an optical fiber and ulexite can be widely used, but an optical fiber is preferably made of glass or plastic. In the case of the above-mentioned fine pores, the amount of light that reaches the surface decreases, but in the case of fine fibers such as optical fibers, the light absorption is suppressed because the light is totally reflected, and the amount of light that reaches the surface increases, which is an advantage.

In a product with an incorporated operation display panel of the present invention, the display panel with a touch sensor may further include a light guide for guiding the light emission direction of the light emitting element between the transparent conductive sheet and the light emitting element array substrate. By providing a light guide between the transparent conductive sheet and the light emitting element array substrate, the effect of allowing the light of the light emitting element to travel straight can be further enhanced. In addition, the shape of the pixels displayed on the front surface of the display panel can be changed from the shape of the light emitting element, and the emission brightness in the pixels can be made uniform. For example, even if the light emitting element has a rectangular shape in a plan view, it is possible to display circular pixels by using a circular light guide. Further, even if the light emission at the center of the light emitting element is strong, the light propagates in the light guide by diffuse reflection of the light, and the emission brightness in the pixel becomes uniform. Further, by making the holes of the light guide diagonally, the display position of the pixels on the front surface of the display panel can be slightly changed.

Here, when the transparent base is provided between the transparent conductive sheet and the light emitting element array substrate, the positional relationship with the light guide may be such that the transparent base is provided on the light guide or the transparent substrate may be provided underneath the light guide.

In a product with an incorporated operation display panel of the present invention, the transparent base may be formed of a flexible resin. By forming the transparent base with a flexible resin, it is possible to produce products with incorporated operation display panels having various shapes.

In a product with an incorporated operation display panel of the present invention, the transparent base preferably has a visible light transmittance of 20% or more. The transmittance of visible light was measured in accordance with the test method for the total light transmittance specified in JIS K 7361-1. A normal privacy filter has a transmittance of 70 to 80, and two privacy filters bonded together may be used as a transparent base. By increasing the transmittance of visible light of the transparent base to 30% and 40%, the amount of light transmitted from the thin layer can be increased and the display can be brightened. Note that if the transmittance of visible light of the transparent substrate is less than 20%, the amount of light transmitted from the thin layer is further lowered, and clear display becomes difficult.

In a product with an incorporated operation display panel of the present invention, the thin layer is preferably composed of a nature-derived wood, natural fiber, natural leather or a natural stone, or a resin, synthetic fiber, synthetic leather or an artificial stone, which are materials produced by imitating the appearance and texture of nature.

A natural touch feeling can be realized by using a naturally-derived material or a material generated by imitating an appearance and touch of nature. Therefore, a polymer material such as a resin can also be used as the material of the thin layer as long as it realizes a natural appearance and has a natural touch feeling. Since the resin is easy to mold, there is an advantage in that a thin layer having a three-dimensionally complicated shape can be produced. Here, the polymer material refers to a material having a large molecular weight, and refers to a polymer obtained by polymerizing a monomer, or a compound having a large molecular weight such as a natural polymer. Moreover, when using resin in an electrostatic capacitance type touch panel, it is preferable that an insulating resin with high dielectric constant is used.

The transparent base that forms the light guide path in the optical axis direction of the light emitting element described above has a heightening effect of delivering light straight to the display surface, but the transparent base itself has a lowering effect of diffusing light. On the other hand, for example, when naturally-derived wood is used as the thin layer, the wood has a heightening effect of diffusing light. Therefore, by combining a transparent base such as a privacy filter with wood, it becomes possible to increase the amount of light that reaches the thin layer made of wood by the mechanism of the privacy filter, and to realize a display with a wide viewing angle on the display surface.

Effects of the Invention

According to a product with an incorporated operation display panel of the present invention, there is an effect that the visibility at the time of light emission is further improved.

BRIEF DESCRIPTION OF THE DRAWINGS

FIG. 5 shows a configuration image view of a product with an incorporated operation display panel of a prior art.

FIG. 6 shows a schematic cross-sectional view of a product with an incorporated operation display panel of a prior art.

BEST MODE FOR CARRYING OUT THE INVENTION

Figure 1:
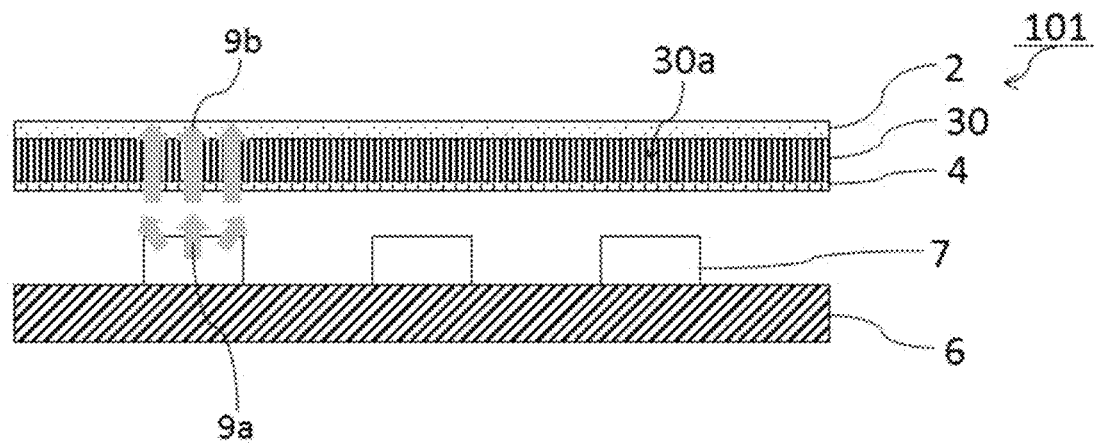
FIG. 1 shows a schematic cross-sectional view of a product with an incorporated operation display panel of an Embodiment 1.

Embodiments of the present invention will be described in detail below with reference to the drawings. The present invention is not limited to the following embodiments and examples shown in the figures, and the present invention can be variously changed in design.

First, in explaining embodiments of the present invention, the basic configuration of a product with an incorporated operation display panel according to the prior art is described.

FIG. 5 shows a configuration image view of a product with an incorporated operation display panel of a prior art. As shown in FIG. 5, the product with the incorporated operation display panel 105 is composed of a wood veneer 2, a transparent base 3, a touch panel sheet 4 as a transparent conductive film, a light guide 5 and an LED array 6 as a light emitting element array. It is sequentially laminated. The wood veneer 2 using Sycamore materials is located on the outer surface of the product with the incorporated operation display panel, and the LED array 6 is configured to be located inside the product. A large number of LED light sources 7 are two-dimensionally arranged in the LED array 6. The light guide 5 guides the light emission direction of each LED light source 7 in the direction perpendicular to the substrate of the LED array 6. Guide holes 5a, in the same number as the number of LED light sources 7, are provided.

In FIG. 5, for convenience of explanation, although not all LED light sources are shown, the LED array 6 is configured of, for example, a total of 6400 LED light sources with 32 vertical by 200 horizontal. One LED light source is composed of planar mounting type LEDs. A point light source is realized by the light of one LED light source, and this can be regarded as one dot, and one character or pattern can be represented by 8×8 dots or 16×16 dots. For example, in the case of the LED array 6 having 6400 LED light sources, a 22-character by 3-line sentence can be expressed. Here, as the LED light source, for example, one with a size of 2 mm×2 mm and 700 to 1000 mcd (Millicandela) is used.

The light guide 5 plays a role of making a character or a pattern formed of light emitted from the LED light source 7 clearly visible through the plate 2. Namely, when the light guides 5 are stacked on the LED array 6, a large number of guide holes 5a are arranged in accordance with the arrangement of the LED light sources 7 so that the guide holes 5a are arranged immediately above each respective LED light source 7.

Next, the structure of the product with the incorporated operation display panel after assembly is described by referring to FIG. 6.

FIG. 6 shows a schematic cross-sectional view of the operation display panel-incorporated article of the prior art. As shown in FIG. 6, in the product with the incorporated operation display panel 105, the wood veneer 2, the transparent base 3, the touch panel sheet 4, the light guide 5 and the LED array 6 are stacked in order from the top and adhered to the housing 8. Of the light emitted from the LED light source 7 disposed on the LED array 6, the obliquely emitted light (9b, 9c) is blocked by the light guide 5, and the emitted light reaches the wood veneer 2 as a straight light like 9a. Note that the housing 8 is mainly made of ABS resin.

The wood veneer 2 and the transparent substrate 3, or the transparent substrate 3 and the touch panel sheet 4, are bonded without providing a gap. On the other hand, a gap $G_1$ is provided between the touch panel sheet 4 and the light guide 5. This is because the light guide 5 is provided with the guide holes 5a, and when the touch panel sheet 4 and the light guide 5 are bonded, a stress variation occurs when operating the touch panel, which becomes a cause of a malfunction.

Also, a gap $G_2$ is provided between the light guide 5 and the LED light source 7. Since the number of LED light sources 7 provided in the LED array 6 and the number of guide holes 5a provided in the light guides 5 are several thousands, when the light guides 5 and the LED arrays 6 are stacked, there is a possibility that an arrangement error occurs. When the light guide 5 and the LED array 6 are bonded in a state where an error occurs, the light emitted from the LED light source 7 does not pass through the guide hole 5a and an accurate display cannot be performed. Therefore, by providing the gap $G_2$, it is possible to prevent deterioration of display quality caused by an error in the arrangement of the LED light source 7 and the guide hole 5a. In addition, since the display quality can be maintained even if there are some errors, the manufacture becomes easy.

Hereinafter, a product with an incorporated operation display panel of the present invention will be described. In the following examples, for convenience of explanation, only the laminated structure of each member is shown, and the housing 8 is not shown.

Embodiment 1

FIG. 1 shows a schematic cross-sectional view of a product with an incorporated operation display panel of an Embodiment 1. As shown in FIG. 1, in the product with an incorporated operation display panel 101, unlike the conventional product with incorporated operation display panel 105, a transparent base 30 is provided instead of the transparent base 3. A large number of micropores are formed as guide holes 30a in the main body of the transparent base 30 which is a resin base material made of a transparent resin. Although not shown, the guide hole 30a is formed by a grid-shaped louver, and the gap between the grid-shaped louvers is a light guide path along the optical axis of the LED light source 7. Alternatively, the guide hole 30a is filled with a translucent material having a refractive index different from that of the main body of the transparent base 30, so that the guide hole 30a serves as a light guide path for the emitted light of the LED light source 7. Namely, the light 9a emitted from the LED light source 7 can efficiently travel straight through the guide hole 30a as light 9b. As a result, the loss of light is reduced, the amount of light when displayed on a thin layer is increased, and the display performance can be improved. Further, by adopting a configuration in which the light guide 5 is not provided, cost reduction and thinning can be achieved.

Embodiment 2

Figure 2:
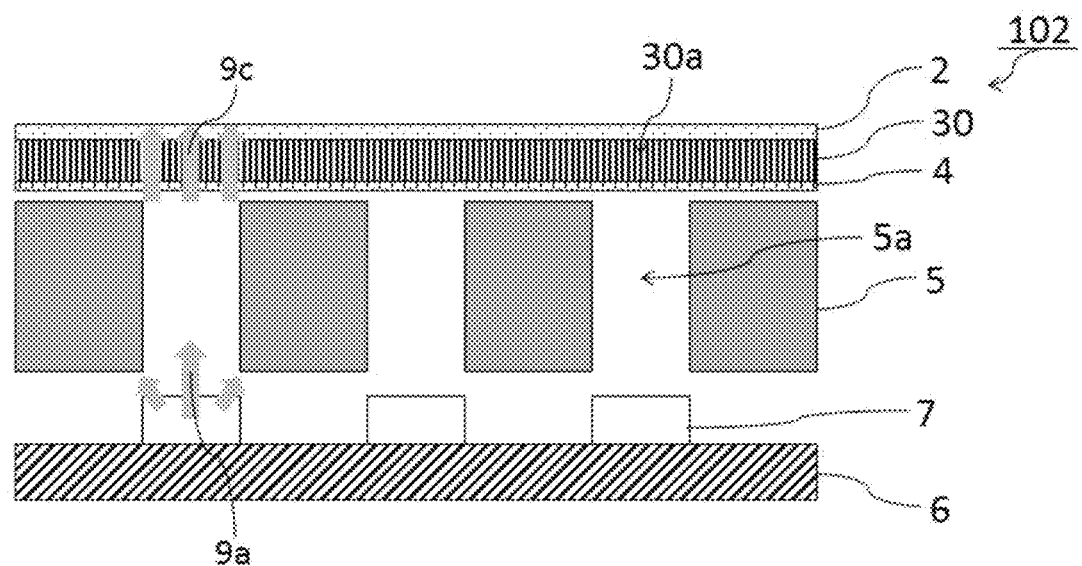
FIG. 2 shows a schematic cross-sectional view of a product with an incorporated operation display panel of an Embodiment 2.

FIG. 2 shows a schematic cross-sectional view of a product with an incorporated operation display panel of an Embodiment 2. As shown in FIG. 2, in the product with incorporated operation display panel 102, as in the product with incorporated operation display panel 101 of Embodiment 1, a transparent base 30 is provided instead of the transparent base 3. A large number of micropores are formed as guide holes 30a in the main body of the transparent base 30, which is a resin base material made of a transparent resin. Although not shown, the guide hole 30a is formed by a grid-shaped louver, and the gap between the grid-shaped louvers functions as a light guide path along the optical axis of the LED light source 7. Alternatively, the guide hole 30a is filled with a translucent material having a refractive index different from that of the main body of the transparent base 30, so that the guide hole 30a serves as a light guide path for the emitted light of the LED light source 7.

However, unlike the product with incorporated operation display panel 101, the product with incorporated operation display panel 102 is provided with a light guide 5. Therefore, the guide hole 30a serves as a light guide path for light passing the light guide 5. That is, the light 9a emitted from the LED light source 7 passes through the guide hole 5a of the light guide 5, and then passes through the guide hole 30a as the light 9c, so that the light passing through the light guide 5 efficiently travels straight. As a result, the loss of light is reduced, the amount of light when displayed on a thin layer is increased, and the display performance can be improved. In addition, effects such as cost reduction and miniaturization of light emitting element components, lower power consumption and suppression of heat generation can be obtained.

Embodiment 3

Figure 3:
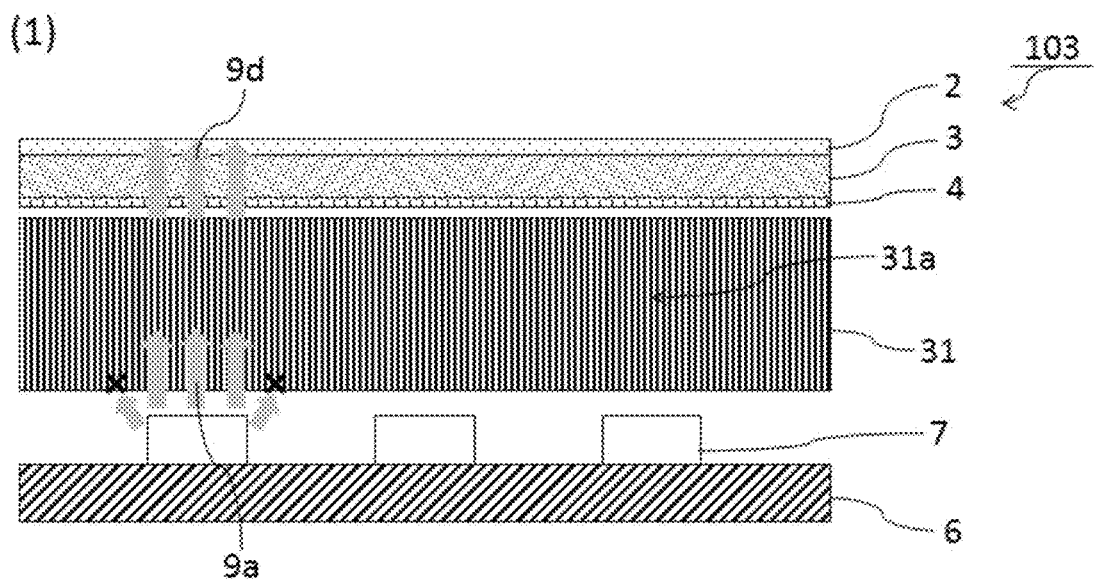
FIG. 3 shows an explanatory view of a product with an incorporated operation display panel of an Embodiment 3.
Figure 3:
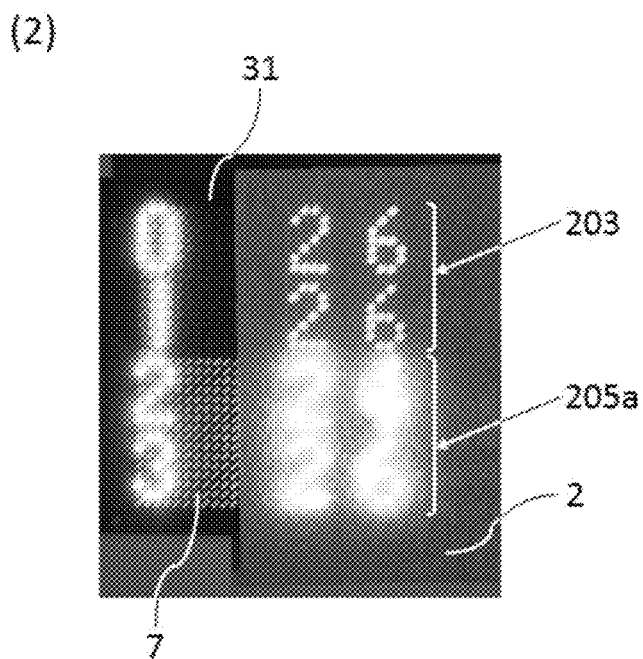

FIG. 3 is an explanatory diagram of a product with an incorporated operation display panel of an Embodiment 3, wherein (1) is a schematic cross-sectional view, and (2) is a display image diagram. As shown in FIG. 3 (1), unlike the prior art, in the product with incorporated operation display panel 103, a transparent base 31 is provided instead of the light guide 5. A large number of micropores are formed as guide holes 31a in the main body of the transparent base 31, which is a resin base material made of a transparent resin. Although not shown, the guide hole 31a is formed by a grid-shaped louver, and the gap between the grid-shaped louvers serves as a light guide path along the optical axis of the LED light source 7. Alternatively, the guide hole 31a is filled with a translucent material having a refractive index different from that of the main body of the transparent base 31, so that the guide hole 31a serves as a light guide path for the emitted light of the LED light source 7. The transparent base 31 shown in FIG. 3 (1) is thicker than the transparent base 30 shown in FIG. 1 or 2, but the thickness of the transparent base is not particularly limited. Namely, the thickness of the transparent base can be decided at various values depending on the needs. For example, if it is desired to increase the rigidity of the transparent base 30, the transparent base 30 may be made thicker, or the transparent base 31 may be configured to be thinner in order to reduce the thickness of the device.

The guide hole 31a serves as a light guide path along the optical axis of the LED light source 7 arranged in the LED array 6, so that the light 9a emitted from the LED light source 7 can efficiently travel straight on. The light traveling straight on through the guide hole 31a becomes the light 9d and reaches the display surface. As a result, the loss of light is reduced, the amount of light displayed on the wood veneer 2 is increased, and the display performance can be improved. Further, since the light 9d is diffused on the wood veneer 2, the viewing angle is widened. Therefore, it is possible to obtain a configuration in which a wide viewing angle can be obtained while increasing the amount of light, and the visibility at the time of light emission is improved. As described above, since the wood veneer 2 is made of sycamore material, it is possible to realize a clear display and a soft appearance display in which the warmth of the natural material can be felt.

The display example 203 at the upper part of the screen shown in FIG. 3 (2) is a screen display image of the product with incorporated operation display panel 103 of Embodiment 3, and the display example 205a at the lower part of the screen shows a case wherein the transparent base 31 is removed from the product with incorporated operation display panel 103. Note that the display on the left side in the display example (203, 205a) shows a state in which the wood veneer 2, the transparent base 3, and the touch panel sheet 4 are removed. As shown in FIG. 3 (2), in the state where the wood veneer 2, the transparent base 3 and the touch panel sheet 4 are removed, the display of "0" and "1" in the display example 203 in which the transparent base 31 is provided, and the display of "2" and "3" in the display example 205a in which the transparent base 31 is not provided, are both clearly displayed.

However, in the state where the wood veneer 2, the transparent base 3 and the touch panel sheet 4 are attached, bleeding occurs in the display of "24" and "26" in the display example 205a in which the transparent base 31 is not provided, and a little bleeding occurs, which makes the display somewhat unclear. In contrast to this, the display of "26" in the upper right and the display "26" in the lower right of the display example 203 provided with the transparent base 31 all have reduced bleeding and are clearly displayed.

As described above, in the state where the wood veneer 2, the transparent base 3 and the touch panel sheet 4 are removed, it has been confirmed that a clear display can be performed with or without the transparent base 31, but in the state where the wood veneer 2, the transparent base 3 and the touch panel sheet 4 are furnished, the transparent base 31 has a high effect of reducing bleeding, and the compatibility of the combination of the wood veneer 2 and the transparent base 31 is extremely good.

Also, in the configuration of this embodiment, effects such as cost reduction, miniaturization of light emitting element parts, power consumption and suppression of heat generation can be obtained. Further, the miniaturization of the light emitting element component contributes to the high density of pixels.

Embodiment 4

Figure 4:
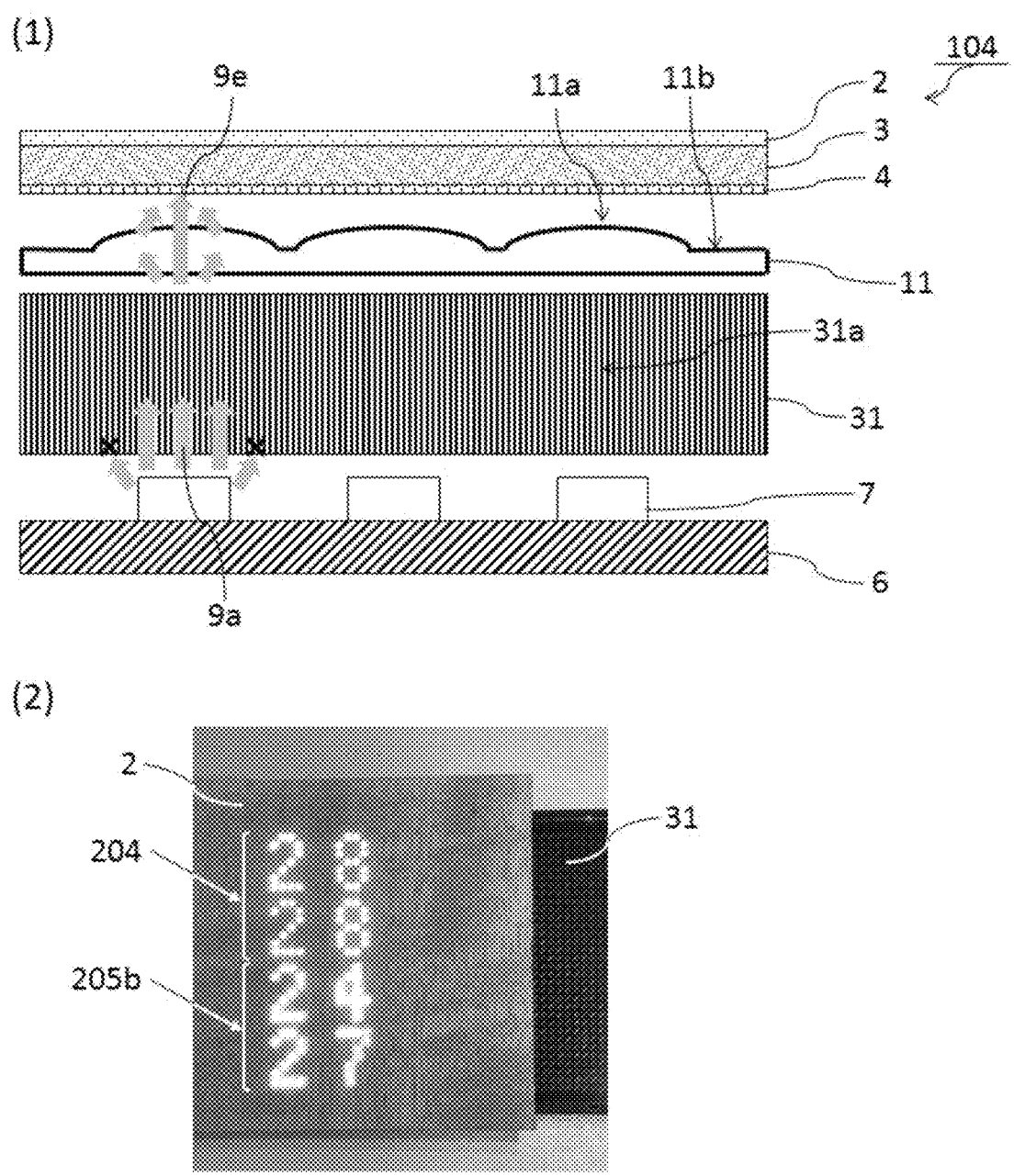
FIG. 4 shows an explanatory view of a product with an incorporated operation display panel of an Embodiment 4.

FIG. 4 is an explanatory diagram of a product with an incorporated operation display panel of an Embodiment 4, wherein (1) is a schematic cross-sectional view, and (2) is a display image diagram. As shown in FIG. 4 (1), in the product with incorporated operation display panel 104, unlike Embodiment 3, the lens array 11 is provided between the touch panel sheet 4 and the transparent base 31. The lens array 11 is a lens array in which lenses 11a are two-dimensionally arranged on a base portion 11b. As the lens 11a, a lens having a light-collecting performance can be widely applied, and for example, a Fresnel lens or the like can be used. Further, for example, by using a fly-eye lens or an aspherical lens instead of a simple condensing lens for the shape of the lens array 11, the light emitted from the rectangular light emitting element is displayed circularly on the front surface of the display panel. It is also possible to display the light in a circular shape or a light emitted from a light emitting element of a point light source in a square shape on the front surface of the display panel.

As shown in FIG. 4 (1), the light 9a emitted from the LED light source 7 can efficiently travel straight through the guide hole 31a formed in the transparent base 31. The light that reaches the lens array 11 becomes a light 9e having a small radiation angle. By using the transparent base 31 and the lens array 11 in combination, the loss of light is reduced, the amount of light displayed on the wood veneer 2 is increased, and the display performance can be further improved. In the display example 204 shown in FIG. 4 (2), the area of 16×16 dots on the upper left of the screen is configured as the product with incorporated operation display panel 104 of Embodiment 4, and the display example 205b on the lower left of the screen is a lens from the product with incorporated operation display panel 104. It is a screen display image of the configuration excluding the array 11. As shown in FIG. 4 (2), in the display example 205b, the display of "24" and "27" is slightly blurred due to bleeding. On the other hand, in the display example 204, it can be seen that the bleeding is reduced and the pixels can be clearly seen in both the upper "28" and the lower "28".

Industrial Applicability

The present invention is useful as a controller of a home appliance, a display of an electronic device, an operation display device mounted on a movable body such as a car, or an operation display device installed in structures such as interiors and exteriors of houses and buildings.

DESCRIPTION OF SYMBOLS

2 Wood veneer
3, 30, 31 Transparent base
4 Touch panel sheet
5 Light guide
5a, 30a, 31a Guide hole
6 LED array
7 LED light source
8 Housing
9a~9e, 90a~90c Light
11 Lens array
11a Lens
11b Base portion
101~105 Product with incorporated operation display panel
203, 204, 205a, 205b Display example
G Gap

The invention claimed is:
1. A product comprising;
a transparent conductive sheet;
a display panel;
a thin layer that covers at least a portion of a front surface of the display panel; and
a transparent substrate that forms a light guiding path, the light guiding path disposed in at least one of the following locations: at an opening between the transparent conductive sheet and the thin layer, or at an opening between the transparent conductive sheet and a light emitting device array substrate;
wherein the thin layer comprises at least one of the following: a nature derived wood, a natural fiber, a natural leather, a natural stone, or a material which imitates a natural appearance and a natural texture;
wherein the transparent substrate has micropores provided in a resin base material made of a transparent resin, said micropores are formed by a set of lattice-like louvers, and a gap between the lattice-like louvers provides a light waveguide along an optical axis of light emitting elements of the light emitting device array substrate; and
wherein the transparent substrate increases an amount of light reaching the thin layer, and a diffusion which occurs due to the thin layer widens a viewing angle of the display panel front surface and improves a visibility of the display panel when the display panel is emitting light.

2. The product of claim 1, wherein the thin layer covers all of the front surface of the display panel.

3. The product of claim 1, wherein the material which imitates a natural appearance and a natural texture material comprises at least one of the following: a resin, a synthetic fiber, a synthetic leather, or an artificial stone.

4. The product of claim 1, wherein the display panel comprises a touch sensor.

5. The product of claim 1, wherein the light emitting device array substrate comprises light emitting elements having an emission direction, and wherein the display panel comprises a light guide configured to guide light along the emission direction between the light emitting element device array substrate and the transparent conductive sheet.

6. The product of claim 1, wherein the transparent substrate comprises a flexible resin.

7. The product of claim 1, wherein the transparent substrate has a visible light transmittance of 20% or more.

8. A product comprising;
a transparent conductive sheet;
a display panel;
a thin layer that covers at least a portion of a front surface of the display panel; and
a transparent substrate that forms a light guiding path, the light guiding path disposed in at least one of the following locations: at an opening between the transparent conductive sheet and the thin layer, or at an opening between the transparent conductive sheet and a light emitting device array substrate;
wherein the thin layer comprises at least one of the following: a nature derived wood, a natural fiber, a natural leather, a natural stone, or a material which imitates a natural appearance and a natural texture;
wherein the transparent substrate has micropores provided in a resin base material made of a transparent resin, and said micropores are filled with a translucent material having a refractive index different from that of the resin base material; and
wherein the transparent substrate increases an amount of light reaching the thin layer, and a diffusion which occurs due to the thin layer widens a viewing angle of the display panel front surface and improves a visibility of the display panel when the display panel is emitting light.

9. The product of claim 8, wherein the thin layer covers all of the front surface of the display panel.

10. The product of claim 8, wherein the material which imitates a natural appearance and a natural texture material comprises at least one of the following: a resin, a synthetic fiber, a synthetic leather, or an artificial stone.

11. The product of claim 8, wherein the display panel comprises a touch sensor.

12. A product comprising;
a transparent conductive sheet;
a display panel;
a thin layer that covers at least a portion of a front surface of the display panel; and
a transparent substrate that forms a light guiding path, the light guiding path disposed in at least one of the following locations: at an opening between the transparent conductive sheet and the thin layer, or at an opening between the transparent conductive sheet and a light emitting device array substrate;
wherein the thin layer comprises at least one of the following: a nature derived wood, a natural fiber, a natural leather, a natural stone, or a material which imitates a natural appearance and a natural texture;
wherein the transparent substrate comprises two louver films which are laminated with louvers arranged orthogonally to each other; and
wherein the transparent substrate increases an amount of light reaching the thin layer, and a diffusion which occurs due to the thin layer widens a viewing angle of the display panel front surface and improves a visibility of the display panel when the display panel is emitting light.

13. The product of claim 12, wherein the thin layer covers all of the front surface of the display panel.

14. The product of claim 12, wherein the material which imitates a natural appearance and a natural texture material comprises at least one of the following: a resin, a synthetic fiber, a synthetic leather, or an artificial stone.

15. The product of claim 12, wherein the display panel comprises a touch sensor.

16. A product comprising;
a transparent conductive sheet;
a display panel;
a thin layer that covers at least a portion of a front surface of the display panel; and
a transparent substrate that forms a light guiding path, the light guiding path disposed in at least one of the following locations: at an opening between the transparent conductive sheet and the thin layer, or at an opening between the transparent conductive sheet and a light emitting device array substrate;
wherein the thin layer comprises at least one of the following: a nature derived wood, a natural fiber, a natural leather, a natural stone, or a material which imitates a natural appearance and a natural texture;
wherein the transparent substrate comprises an aggregate of fine fibers; and
wherein the transparent substrate increases an amount of light reaching the thin layer, and a diffusion which occurs due to the thin layer widens a viewing angle of the display panel front surface and improves a visibility of the display panel when the display panel is emitting light.

17. The product of claim 16, wherein the fine fibers include optical fibers made of at least one of the following: glass, or plastic.

18. The product of claim 16, wherein the thin layer covers all of the front surface of the display panel.

19. The product of claim 16, wherein the material which imitates a natural appearance and a natural texture material comprises at least one of the following: a resin, a synthetic fiber, a synthetic leather, or an artificial stone.

20. The product of claim 16, wherein the display panel comprises a touch sensor.

* * * * *